(12) United States Patent
Liu et al.

(10) Patent No.: US 12,342,619 B2
(45) Date of Patent: Jun. 24, 2025

(54) ARRAY SUBSTRATE, DISPLAY PANEL, DISPLAY APPARATUS, AND METHOD FOR MANUFACTURING ARRAY SUBSTRATE

(71) Applicants: Hefei Xinsheng Optoelectronics Technology Co., Ltd., Anhui (CN); BOE Technology Group Co., Ltd., Beijing (CN)

(72) Inventors: Ning Liu, Beijing (CN); Dacheng Zhang, Beijing (CN); Cheng Xu, Beijing (CN); Danyang Ma, Beijing (CN); Liusong Ni, Beijing (CN); Jun Liu, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 581 days.

(21) Appl. No.: 17/787,686

(22) PCT Filed: Aug. 4, 2021

(86) PCT No.: PCT/CN2021/110676
§ 371 (c)(1),
(2) Date: Jun. 21, 2022

(87) PCT Pub. No.: WO2022/062701
PCT Pub. Date: Mar. 31, 2022

(65) Prior Publication Data
US 2023/0015542 A1    Jan. 19, 2023

(30) Foreign Application Priority Data
Sep. 25, 2020   (CN) .......................... 202011019932.2

(51) Int. Cl.
*H10D 86/40*      (2025.01)
*H10D 30/67*      (2025.01)
(Continued)

(52) U.S. Cl.
CPC ......... *H10D 86/423* (2025.01); *H10K 50/865* (2023.02); *H10K 71/00* (2023.02); *H10K 59/1201* (2023.02); *H10K 59/131* (2023.02)

(58) Field of Classification Search
CPC .. H10D 86/423; H10D 86/60; H10D 30/6723; H10D 30/673; H10D 30/6755;
(Continued)

(56) References Cited

U.S. PATENT DOCUMENTS

2015/0243718 A1*  8/2015  Kwon .................. H10D 86/451
                                                             257/43
2016/0079429 A1   3/2016  Ellinger et al.
(Continued)

FOREIGN PATENT DOCUMENTS

CN     107068692 A    8/2017
CN     111312725 A    6/2020
CN     112151555 A    12/2020

OTHER PUBLICATIONS

CN202011019932.2 first office action.
CN202011019932.2 second office action.
CN202011019932.2 Decision of Rejection.

*Primary Examiner* — Mohsen Ahmadi
(74) *Attorney, Agent, or Firm* — IPro, PLLC

(57) ABSTRACT

Provided are an array substrate, a display panel, a display apparatus and a method for manufacturing an array substrate. The array substrate includes: a base substrate; an active layer, which is located on one side of the base substrate, where the active layer includes a channel region, a conductive source region, which is located on one side of the channel region, and a conductive drain region, which is (Continued)

located on the other side of the channel region; and a metal layer, which is located on the side of the active layer that is away from the base substrate, where the metal layer includes a gate electrode and a signal line, which are arranged on the same layer, and the thickness of the gate electrode perpendicular to the base substrate is less than the thickness of the signal line perpendicular to the base substrate.

18 Claims, 6 Drawing Sheets

(51) Int. Cl.
  *H10D 86/60* (2025.01)
  *H10K 50/86* (2023.01)
  *H10K 59/12* (2023.01)
  *H10K 59/121* (2023.01)
  *H10K 59/131* (2023.01)
  *H10K 71/00* (2023.01)

(58) Field of Classification Search
  CPC ............. H10K 59/1201; H10K 59/131; H10K 59/1213
  See application file for complete search history.

(56) References Cited

U.S. PATENT DOCUMENTS

| | | | |
|---|---|---|---|
| 2017/0323904 A1* | 11/2017 | Kim | H10K 59/123 |
| 2019/0123069 A1* | 4/2019 | Yang | H10D 86/441 |
| 2020/0144309 A1* | 5/2020 | Jeon | H10D 86/451 |
| 2021/0020755 A1* | 1/2021 | Yan | H10D 30/0321 |
| 2021/0367017 A1* | 11/2021 | Liu | H10D 86/60 |

* cited by examiner

ARRAY SUBSTRATE, DISPLAY PANEL, DISPLAY APPARATUS, AND METHOD FOR MANUFACTURING ARRAY SUBSTRATE

CROSS REFERENCE TO RELATED APPLICATIONS

The present disclosure is a National Stage of International Application No. PCT/CN2021/110676, filed Aug. 4, 2021, which claims the priority from Chinese Patent Application No. 202011019932.2, filed to the China National Intellectual Property Administration on Sep. 25, 2020 and entitled "ARRAY SUBSTRATE, DISPLAY PANEL, DISPLAY APPARATUS, AND METHOD FOR MANUFACTURING ARRAY SUBSTRATE", which is incorporated in the present disclosure in its entirety by reference.

FIELD

The present disclosure relates to the technical field of display, in particular to an array substrate, a display panel, a display device and a manufacturing method.

BACKGROUND

Owing to a top-gate thin-film transistor is provided with a short channel, an on-state current Ion of a top-gate thin-film transistor is effectively improved, thereby obviously improving a display effect, and effectively reducing power consumption. Moreover, since an area of a gate electrode overlapping a source electrode and a drain electrode of the top-gate thin-film transistor is small, relatively small parasitic capacitance is generated, and fault possibility is reduced. With the above remarkable advantages, the top-gate thin-film transistor has attracted increasing attention.

SUMMARY

An embodiment of the present disclosure provides an array substrate. The array substrate includes:
  a substrate;
  an active layer, on a side of the substrate, where the active layer includes a channel region, a conductive source region, located on one side of the channel region, and a conductive drain region, located on the other side of the channel region; and
  a metal layer, disposed on a side of the active layer facing away from the substrate, where the metal layer includes a gate electrode and a signal line, the gate electrode and the signal line are arranged on a same layer, and in a direction perpendicular to the substrate, a thickness of the gate electrode is less than a thickness of the signal line.

In some embodiments, the array substrate further includes:
  a gate insulation layer, between the active layer and the metal layer;
  where the gate insulation layer includes: a first insulation portion and a second insulation portion;
  the first insulation portion includes a first overlap portion overlapping the gate electrode, and a first extension portion extending from the first overlap portion;
  the second insulation portion includes a second overlap portion overlapping the signal line, and a second extension portion extending from the second overlap portion;
  a length of the first extension portion in a first direction is greater than a length of the second extension portion in a direction perpendicular to an extension direction of the signal line; and
  the first direction is a direction in which one of the conductive source region and the conductive drain region points to the other.

In some embodiments, the metal layer includes a first metal layer and a second metal layer;
  the first metal layer and the second metal layer are stacked, and the second metal layer is disposed on a side of the first metal layer facing away from the gate insulation layer.
  in the direction perpendicular to the substrate, the thickness of the gate electrode is equal to a thickness of the second metal layer, and the thickness of the signal line is equal to a total thicknesses of the first metal layer and the second metal layer.

In some embodiments, in the direction perpendicular to the substrate, a thickness of the first metal layer is less than the thickness of the second metal layer.

In some embodiments, a difference between the length of the first extension portion in the first direction and the length of the second extension portion in the direction perpendicular to the extension direction of the signal line ranges from 0.1 μm to 1 μm.

In some embodiments, the signal line includes at least one of:
  a gate line;
  a power line; or
  a touch lead.

In some embodiments, the array substrate further includes:
  a buffer layer, between the substrate and the active layer; and
  a light-shielding layer, between the buffer layer and the substrate;
  where an orthographic projection of the light-shielding layer on the substrate covers an orthographic projection of the active layer on the substrate.

In some embodiments, the array substrate further includes:
  an interlayer dielectric layer, disposed on a side of the metal layer facing away from a gate insulation layer; and
  a source-drain electrode layer, disposed on a side of the interlayer dielectric layer facing away from the metal layer;
  where the source-drain electrode layer includes a source electrode and a drain electrode;
  the drain electrode is connected with the conductive drain region through a first through hole penetrating the interlayer dielectric layer;
  the source electrode is connected with the conductive source region through a second through hole penetrating the interlayer dielectric layer; and
  the source electrode is connected with the light-shielding layer through a third through hole penetrating the interlayer dielectric layer and the buffer layer.

In some embodiments, the array substrate further includes: a passivation layer, disposed on a side of the source-drain electrode layer facing away from the interlayer dielectric layer.

An embodiment of the present disclosure further provides a display panel. The display panel includes the array substrate provided in the embodiment of the present disclosure.

An embodiment of the present disclosure further provides a display device. The display device includes the above display panel provided in the embodiment of the present disclosure.

An embodiment of the present disclosure further provides a manufacturing method for an array substrate. The manufacturing method includes:

forming an active layer on a substrate; and forming a metal layer on a side, facing away from the substrate, of the active layer;

where a thickness of the metal layer in a first region is less than a thickness of the metal layer in a second region, the first region is a region in which a gate electrode is formed, and the second region is a region in which a signal line is formed.

In some embodiments, after the forming the active layer on a substrate, and before the forming the metal layer on the side, facing away from the substrate, of the active layer, the manufacturing method further includes:

forming a gate insulation layer on a side, facing away from the substrate, of the active layer; and after the forming the metal layer on the side, facing away from the substrate, of the active layer, the manufacturing method further includes:

forming a patterned photoresist layer on a side, facing away from the gate insulation layer, of the metal layer that is; where the patterned photoresist layer is provided with a first photoresist portion in a region where the gate electrode is located, and the patterned photoresist layer is provided with a second photoresist portion in a region where the signal line is located;

etching the metal layer in the first region and the second region for the same time under shielding actions of the first photoresist portion and the second photoresist portion, so as to form the gate electrode and the signal line, where a line width difference between the first photoresist portion and the gate electrode is greater than a line width difference between the second photoresist portion and the signal line;

etching the gate insulation layer under shielding actions of the first photoresist portion and the second photoresist portion to form the gate insulation layer providing with a first insulation portion and a second insulation portion, where the first insulation portion comprises a first overlap portion overlapping the gate electrode, and a first extension portion extending from the first overlap portion, the second insulation portion includes a second overlap portion overlapping the signal line, and a second extension portion extending from the second overlap portion, a length of the first extension portion in a first direction is greater than a length of the second extension portion in a direction perpendicular to an extension direction of the signal line, and the first direction is a direction in which one of the conductive source region and the conductive drain region points to the other;

making the active layer conductive under shielding actions of the first insulation portion and the second insulation portion, so as to form a conductive source region of the active layer and a conductive drain region of the active layer; and removing the first photoresist portion and the second photoresist portion.

In some embodiments, after the step of forming the metal layer on the side of the active layer facing away from the substrate, the manufacturing method further includes:

forming a first metal layer on a side, facing away from the active layer, of the gate insulation layer, removing the first metal layer in the first region, and retaining the first metal layer in the second region; and forming a second metal layer on a side, facing away from the gate insulation layer, of the first metal layer.

In some embodiments, the step of etching the metal layer in the first region and the second region for the same time includes:

etching the metal layer in the first region and the second region for the same time with a wet etching process.

In some embodiments, before the step of forming the active layer on a substrate, the manufacturing method further includes:

forming a light-shielding layer on the substrate; and forming a buffer layer on the light-shielding layer.

In some embodiments, after the step of removing the first photoresist portion and the second photoresist portion, the manufacturing method further includes:

forming an interlayer dielectric layer on a side, facing away from the gate insulation layer, of the metal layer;

forming a source-drain electrode layer on a side, facing away from the metal layer, of the interlayer dielectric layer; and forming a passivation layer on a side, facing away from the interlayer dielectric layer, of the source-drain electrode layer.

DETAILED DESCRIPTION OF THE EMBODIMENTS

In order to make the objectives, technical solutions and advantages of embodiments of the present disclosure more obvious, the technical solutions of the present disclosure will be clearly and completely described below in combination with the accompanying drawings in the embodiments of the present disclosure. Apparently, the described embodiments are merely some rather than all of the embodiments of the present disclosure. On the basis of the described embodiments of the present disclosure, all other embodiments obtained by those skilled in the art without making creative efforts fall within the scope of protection of the present disclosure.

Unless otherwise defined, technical terms or scientific terms used in the present disclosure should have the ordinary meanings understood by those of ordinary skill in the art to which the present disclosure belongs. "First", "second" and other similar words used in the present disclosure do not indicate any order, quantity or importance, but are merely used to distinguish between different components. "Comprise", "include" or other similar words mean that an element or object appearing before the word contains elements or objects listed after the word and equivalents thereof, without excluding other elements or objects. "Connect", "connected" or other similar words are not limited to physical or mechanical connections, but may include electrical connections, whether direct or indirect. The terms "up", "down", "left", "right", etc. are merely used to indicate relative position relations, and when the absolute position of a described object changes, the relative position may change accordingly.

In order to keep the following descriptions of embodiments of the present disclosure clear and concise, the present disclosure omits detailed descriptions of known functions and known components.

Figure 1:
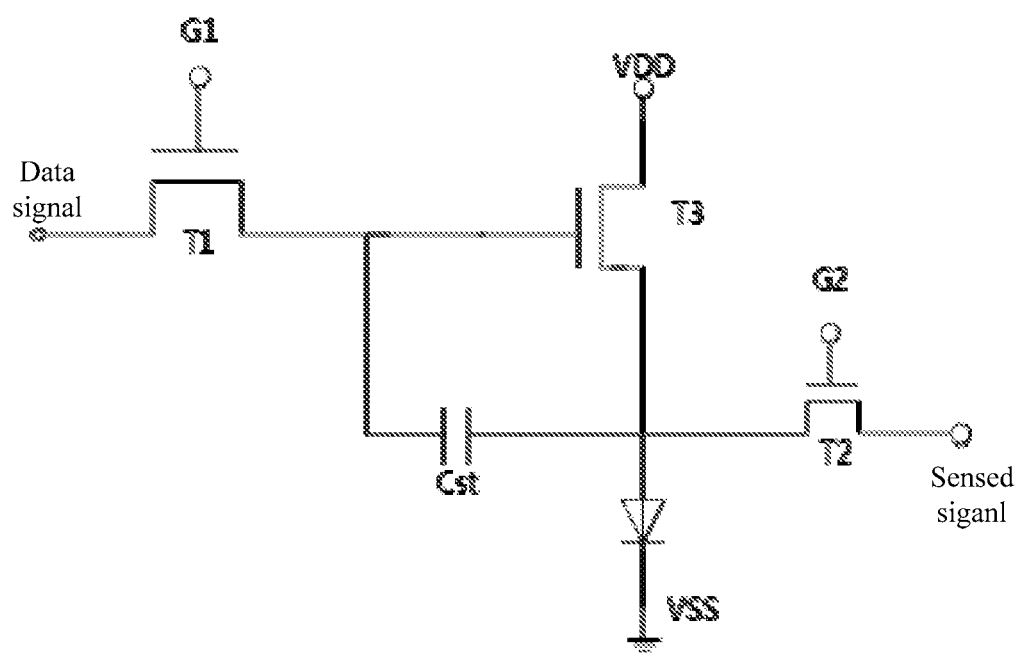
FIG. 1 is a structural schematic diagram of a three transistor-one capacitor (3T1C) circuit structure.
Figure 2:
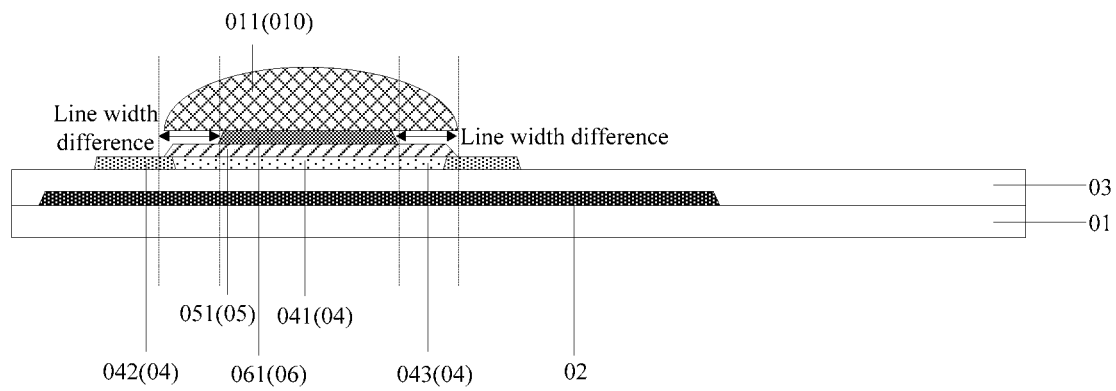
FIG. 2 is a structural schematic diagram under the situation of making an active layer conductive in the prior art.

As shown in FIGS. 1 and 2, in a circuit design of a top-gate active-matrix organic light-emitting diode (AMO-LED) product, a three transistor-one capacitor (3T1C) structure is often used, and an indium gallium zinc oxide (IGZO) semiconductor is used as an active layer. In an actual technological process, after a gate electrode layer 06 (Gate) is exposed and etched to be patterned, a lower gate insulation layer 05 (GI) is etched with a self-aligning process, and then an active layer 04 (Act) is made conductive. In order to prevent He plasma from transversely diffusing in a channel of the Act and prevent metal atoms of the upper Gate from diffusing into the channel by means of two ends of the Act in a conductor process, in the process, a line width difference between the Gate etched and a photoresist 010 (PR) is made large, that is, the line width difference (CD bias) formed is relatively large such that the PR may better prevent the GI on a left side and a right side under a Gate pattern from being etched, thereby forming insulation tails (GI tails) each having a certain width. Therefore, the conductor process for the lower Act is protected and limited to a certain degree, the He plasma may be effectively prevented from transversely diffusing in the channel of the Act and the metal atoms of the upper Gate may be effectively prevented from diffusing into the channel by means of the two ends of the Act in the conductor process, thereby ensuring stability of characteristics of a thin-film transistor.

However, as display products progressively become large in size and high in pixels per inch (PPI), increasingly high metal wiring density is required, and increasingly narrow metal wires are required, which requires that a critical dimension of the PR exposed should be as close as possible to a critical dimension after final etching is completed, that is, the CD bias should be as small as possible. Therefore, on the one hand, conductivity may be enhanced, and on the other hand, high incidence of wire breakage caused by over narrow critical dimension after etching is completed may be prevented. This is in contradiction with the requirement that the CD bias formed after the Gate is etched should be large in the above conductor process for the Act.

Figure 3:
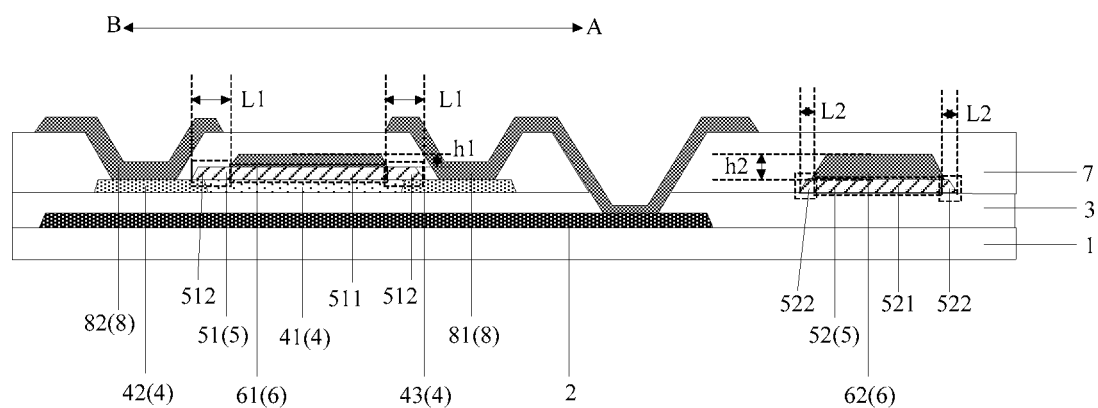
FIG. 3 is a structural schematic diagram of an array substrate provided in an embodiment of the present disclosure.

In order to solve the above problems, as shown in FIG. 3, an embodiment of the present disclosure provides an array substrate. The array substrate includes:

a substrate 1;

an active layer 4, on a side of the substrate 1, where the active layer 4 includes a channel region 41, a conductive source region 43, located on one side of the channel region 41, and a conductive drain region 42, located on the other side of the channel region 41; and a metal layer 6, disposed on a side of the active layer 4 facing away from the substrate 1, where the metal layer 6 includes a gate electrode 61 and a signal line 62, the gate electrode 61 and the signal line 62 are arranged on the same layer, and in a direction perpendicular to the substrate 1, a thickness h1 of the gate electrode 61 is less than a thickness h2 of the signal line 62.

In the embodiment of the present disclosure, by making the thickness h1 of the gate electrode 61 perpendicular to the substrate 1 than the thickness h2 of the signal line 62 perpendicular to the substrate 1, when the metal layer including the gate electrode 61 and the signal line 62 is manufactured, the metal layer at a position for forming the gate electrode 61 is thinner, the metal layer at a position for forming the signal line 62 is thicker. Therefore, when the metal layer at different positions are etched under shielding actions of photoresists subsequently, with the same etching time, since the metal layer at the position for forming the gate electrode 61 is thinner, an over-etching amount at this position is larger, and since the metal layer at the position for forming the signal line 62 is thicker, an over-etching amount at this position is small. Then, when the gate insulation layer is etched subsequently, the insulation tail (GI tail) at the position where the gate electrode 61 is located of the gate insulation layer 51 may be relatively large. Thus, when the active layer 4 is made conductive subsequently, a relatively long region which is not made conductive may be formed, thereby effectively preventing the plasma from transversely diffusing into the channel 41 in the conductor process, and satisfying requirements of characteristics of the thin-film transistor and conductivity of the signal line. Moreover, a risk of metal breakage is reduced to the maximum extent, thereby improving display quality of a product.

In some embodiments, as shown in FIG. 3, the array substrate may further include a gate insulation layer 5, which is disposed between the active layer 4 and the metal layer 6. The gate insulation layer 5 includes: a first insulation portion 51 and a second insulation portion 52, the first insulation portion 51 includes a first overlap portion 511 overlapping the gate electrode 61, and a first extension portion 512 extending from the first overlap portion 511, and the second insulation portion 52 includes a second overlap portion 521 overlapping the signal line 62, and a second extension portion 522 extending from the second overlap portion 521. A length L1 of the first extension portion 512 in a first direction AB is greater than a length L2 of the second extension portion 522 in a direction perpendicular to an extension direction of the signal line 62. The first direction AB is a direction in which one of the conductive source region 43 and the conductive drain region 42 points to the other, that is, the first direction AB may be a direction in which the conductive source region 43 points to the conductive drain region 42, or a direction in which the conductive drain region 42 points to the conductive source region 43.

Figure 4:
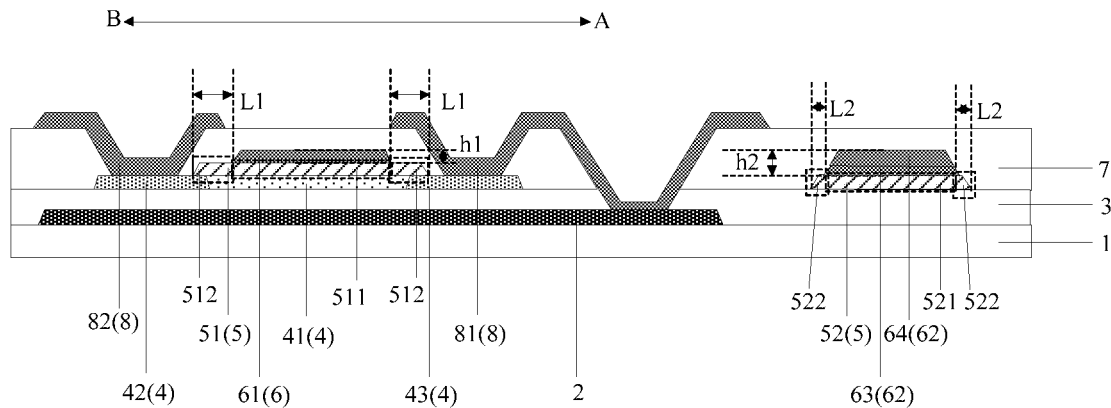
FIG. 4 is a structural schematic diagram of a specific array substrate provided in an embodiment of the present disclosure.

In some embodiments, as shown in FIG. 4, the metal layer 6 includes a first metal layer 63 and a second metal layer 64, the first metal layer 63 and the second metal layer 64 are stacked. The second metal layer 64 is disposed on one side of the first metal layer 63 facing away from the gate insulation layer 5. In the direction perpendicular to the substrate 1, a thickness of the gate electrode 61 is equal to a thickness of the second metal layer 64, and a thickness of the signal line 62 is equal to total thicknesses of the first metal layer 63 and the second metal layer 64. In an embodiment of the present disclosure, when the metal layer 6 is manufactured, the first metal layer 63 may be formed first, the first metal layer 63 in a region where the gate electrode 61 is located is removed, and the first metal layer 63 in a region where the signal line 62 is located is retained. Then, the second metal layer 64 is formed, and the second metal layer 64 covers the region where the gate electrode 61 is located and also covers the region where the signal line 62 is located, such that a thickness of the metal layer 6 in the region where the gate electrode 61 is located is than a thickness of the metal layer 6 in the region where the signal line 62 is located, which is conducive to simplifying manufacturing of the metal layer 6 having different thicknesses in different regions.

In some embodiments, in the direction perpendicular to the substrate 1, a thickness of the first metal layer 63 is less than a thickness of the second metal layer 64. In the embodiment of the present disclosure, the thickness of the first metal layer 63 is less than the thickness of the second metal layer 64, such that the gate electrode 61 and the signal line 62 have a relatively large thickness difference.

In some embodiments, a difference between the length L1 of the first extension portion 512 in the first direction AB and the length L2 of the second extension portion 522 in the direction perpendicular to the extension direction of the signal line 62 ranges from 0.1 μm to 1 μm.

In some embodiments, the signal line 62 includes at least one of: a gate line, a power line or a touch lead.

In some embodiments, as shown in FIG. 3, the array substrate further includes: a buffer layer 3, which is between the substrate 1 and the active layer 4, and a light-shielding layer 2, which is between the buffer layer 3 and the substrate 1, where an orthographic projection of the light-shielding layer 2 on the substrate 1 covers an orthographic projection of the active layer 4 on the substrate 1.

In some embodiments, as shown in FIG. 3, the array substrate further includes an interlayer dielectric layer 7, which is disposed on one side of the metal layer 6 facing away from a gate insulation layer 5, and a source-drain electrode layer 8, which is disposed on one side of the interlayer dielectric layer 7 facing away from the metal layer 6. The source-drain electrode layer 8 includes a source electrode 81 and a drain electrode 82, the drain electrode 82 is connected with the conductive drain region 42 through a first through hole penetrating the interlayer dielectric layer 7, and the source electrode 81 is connected with the conductive source electrode 43 through a second through hole penetrating the interlayer dielectric layer 7, and the source electrode 81 is connected with the light-shielding layer 2 through a third through hole penetrating the interlayer dielectric layer 7 and the buffer layer 3.

Figure 5:
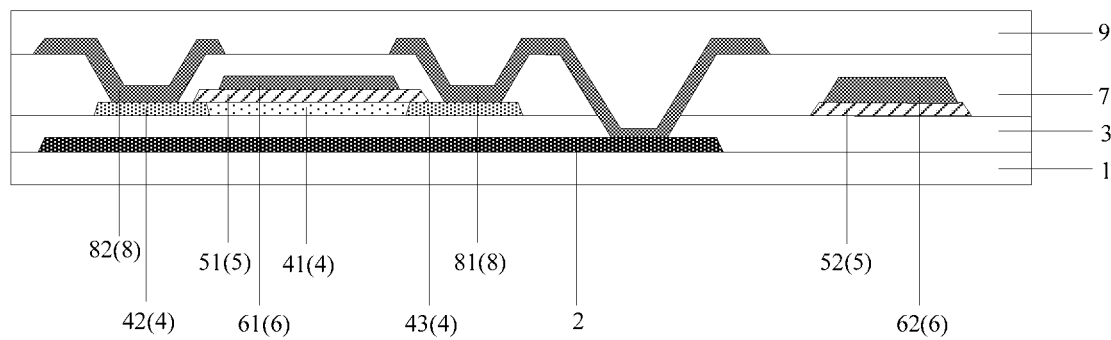
FIG. 5 is a structural schematic diagram of an array substrate having a passivation layer provided in an embodiment of the present disclosure.

In some embodiments, as shown in FIG. 5, the array substrate further includes: a passivation layer 9, disposed on one side of the source-drain electrode layer 8 facing away from the interlayer dielectric layer 7.

An embodiment of the present disclosure further provides a display panel. The display panel includes the array substrate provided in the embodiment of the present disclosure.

An embodiment of the present disclosure further provides a display device. The display device includes the display panel provided in the embodiment of the present disclosure.

Figure 6A:
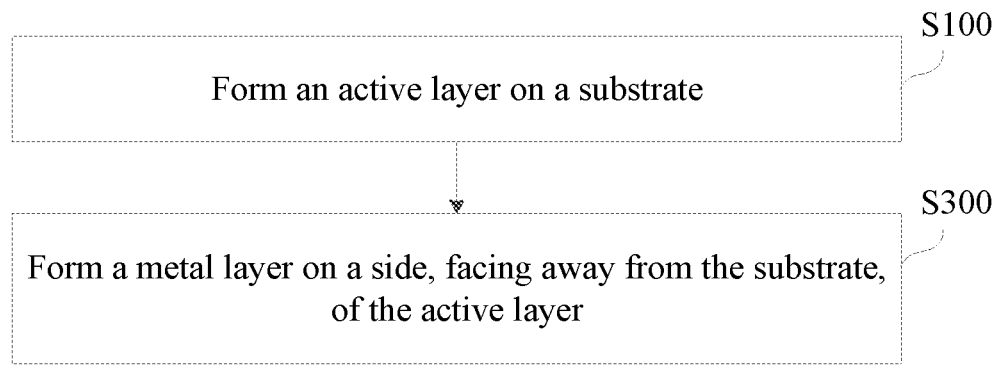
FIG. 6A is a schematic diagram of a manufacturing process for an array substrate provided in an embodiment of the present disclosure.

On the basis of the same inventive concept, an embodiment of the present disclosure further provides a manufacturing method for an array substrate. As shown in FIG. 6A, the manufacturing method includes:

step S100, form an active layer on a substrate; and step S300, form a metal layer on a side, facing away from the substrate, of the active layer;

where a thickness of the metal layer in a first region is less than a thickness of the metal layer in a second region, the first region is a region in which a gate electrode is formed, and the second region is a region in which a signal line is formed. In some embodiments, the step may include: form a first metal layer on one side of a gate insulation layer facing away from an active layer, remove the first metal layer in the first region, and retain the first metal layer in the second region; and form a second metal layer on one side of the first metal layer facing away from the gate insulation layer.

Figure 6B:
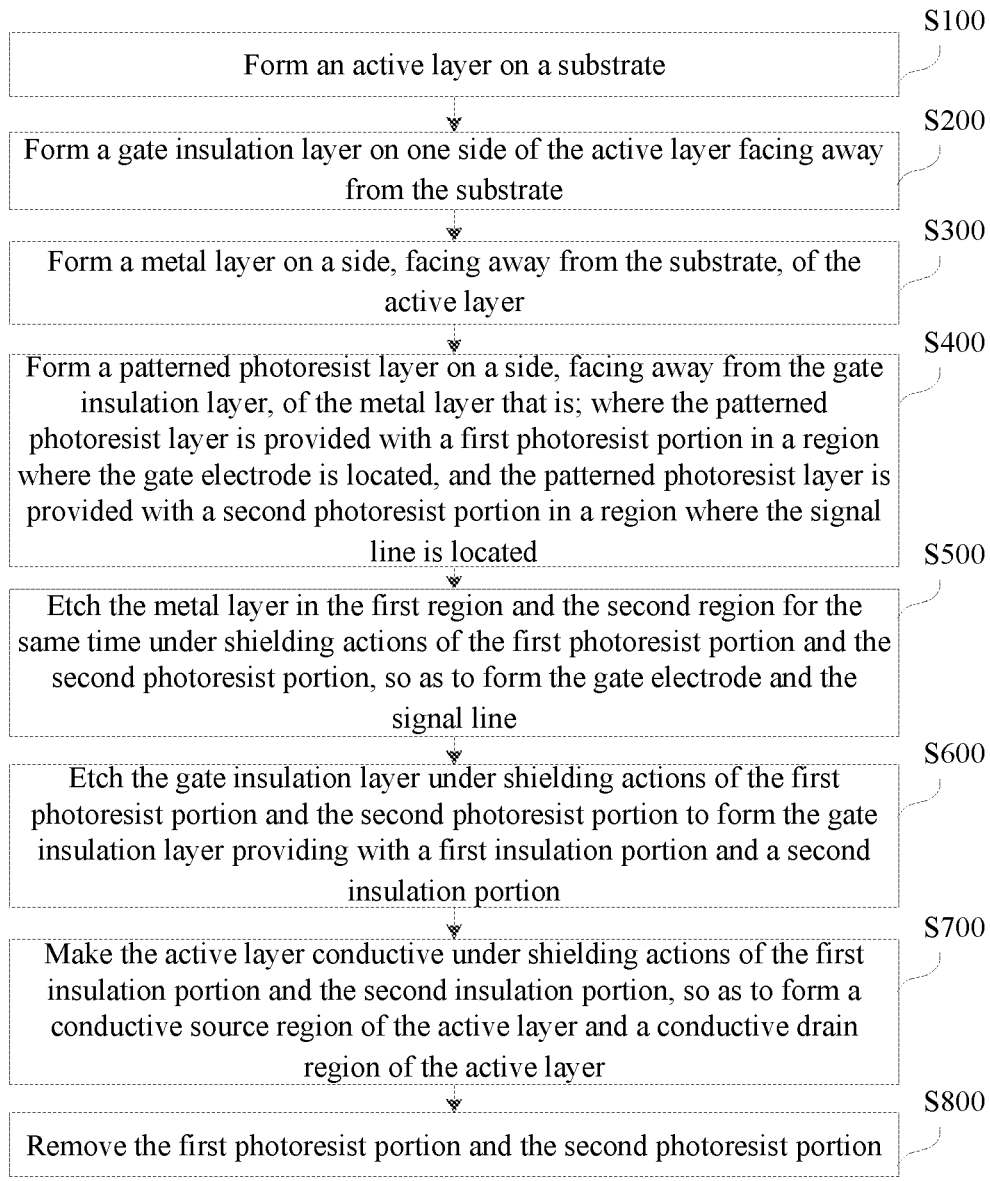
FIG. 6B is a schematic diagram of a manufacturing process for a specific array substrate provided in an embodiment of the present disclosure.

In some embodiments, as shown in FIG. 6B, after the step S100 and before the step S 300, that is, after the step of forming an active layer on a substrate, and before the step of forming a metal layer on the side, facing away from the substrate, of the active layer, the manufacturing method further includes: step S200: form a gate insulation layer on one side of the active layer facing away from the substrate.

After the step S300, that is, after the step of forming a metal layer on the side, facing away from the substrate, of the active layer, the manufacturing method further includes:

step S400: form a patterned photoresist layer on a side, facing away from the gate insulation layer, of the metal layer that is; where the patterned photoresist layer is provided with a first photoresist portion in a region where the gate electrode is located, and the patterned photoresist layer is provided with a second photoresist portion in a region where the signal line is located;

step S500: etch the metal layer in the first region and the second region for the same time under shielding actions of the first photoresist portion and the second photoresist portion, so as to form the gate electrode and the signal line, where a line width difference between the first photoresist portion and the gate electrode is greater than a line width difference between the second photoresist portion and the signal line;

step S600: etch the gate insulation layer under shielding actions of the first photoresist portion and the second photoresist portion to form the gate insulation layer providing with a first insulation portion and a second insulation portion, where the first insulation portion comprises a first overlap portion overlapping the gate electrode, and a first extension portion extending from the first overlap portion, the second insulation portion comprises a second overlap portion overlapping the signal line, and a second extension portion extending from the second overlap portion, a length of the first extension portion in a first direction is greater than a length of the second extension portion in a direction perpendicular to an extension direction of the signal line, and the first direction is a direction in which one of the conductive source region and the conductive drain region points to the other;

step S700: make the active layer conductive under shielding actions of the first insulation portion and the second insulation portion, so as to form a conductive source region of the active layer and a conductive drain region of the active layer; and step S800: remove the first photoresist portion and the second photoresist portion.

In some embodiments, before the step S100, that is, before the step of forming an active layer on a substrate, the manufacturing method further includes:

form a light-shielding layer on the substrate; and form a buffer layer on the light-shielding layer.

In some embodiments, after the step S800, that is, after the step of removing the first photoresist and the second photoresist, the manufacturing method further includes:

form an interlayer dielectric layer on one side of the metal layer facing away from the gate insulation layer;

form a source-drain electrode layer on one side of the interlayer dielectric layer facing away from the metal layer; and form a passivation layer on one side of the source-drain electrode layer facing away from the interlayer dielectric layer.

In order to clearly understand the manufacturing method for an array substrate provided in the embodiment of the present disclosure, the manufacturing method for an array substrate provided in the embodiment of the present disclosure will be described in detail below in combination with FIGS. 7-11.

Figure 7:
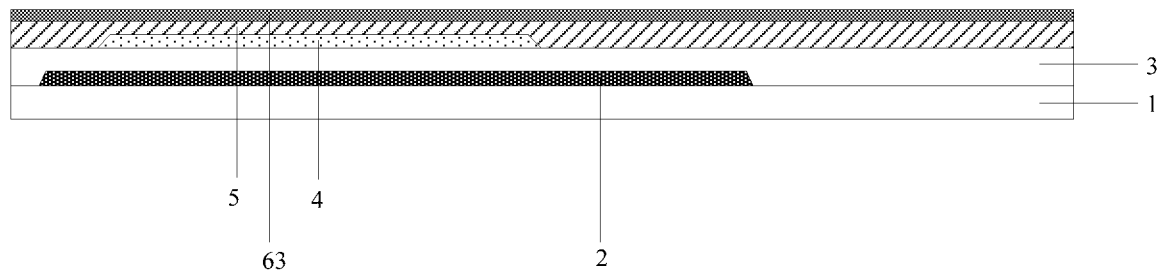
FIG. 7 is a structural schematic diagram of an array substrate having a first metal layer 63 manufactured in an embodiment of the present disclosure.

Step 1, sequentially carry out deposition and patterning to form a pattern of a light-shielding layer 2, a buffer layer 3, a pattern of an active layer 4 and a gate insulation layer 5 on a substrate 1, and then carry out deposition to form a relatively thin first metal layer 63, which is as shown in FIG. 7.

Figure 8:
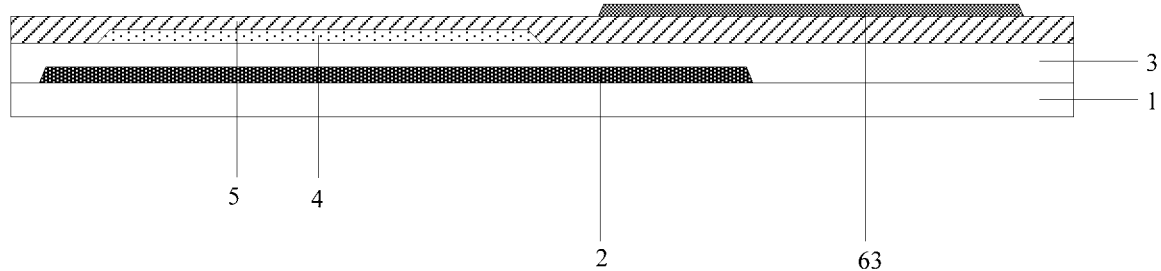
FIG. 8 is a structural schematic diagram of an array substrate having a first metal layer 63 patterned in an embodiment of the disclosure.

Step 2, carry out an exposure, development and patterning process and a wet etching process to completely etch off the first metal layer 63 at a position where a gate electrode 61 is required to be formed, and to completely retain the first metal layer 63 in a position where a signal line 61 is required to be formed, where a schematic diagram of a formed pattern is as shown in FIG. 8 on the right.

Figure 9:
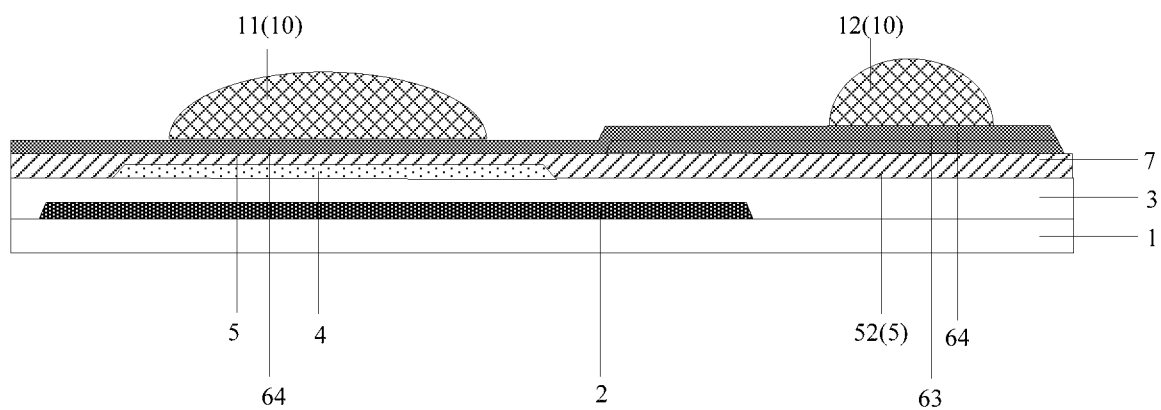
FIG. 9 is a structural schematic diagram of an array substrate having a patterned photoresist layer 10 manufactured in an embodiment of the present disclosure.

Step 3, carry out deposition to form a relatively thick second metal layer 64, and then carry out an exposure, development and patterning process to form a photoresist pattern, a schematic diagram of which is as shown in FIG. 9 on the right, where the photoresist layer 10 includes a first photoresist portion 11 and a second photoresist portion 12.

Figure 10:
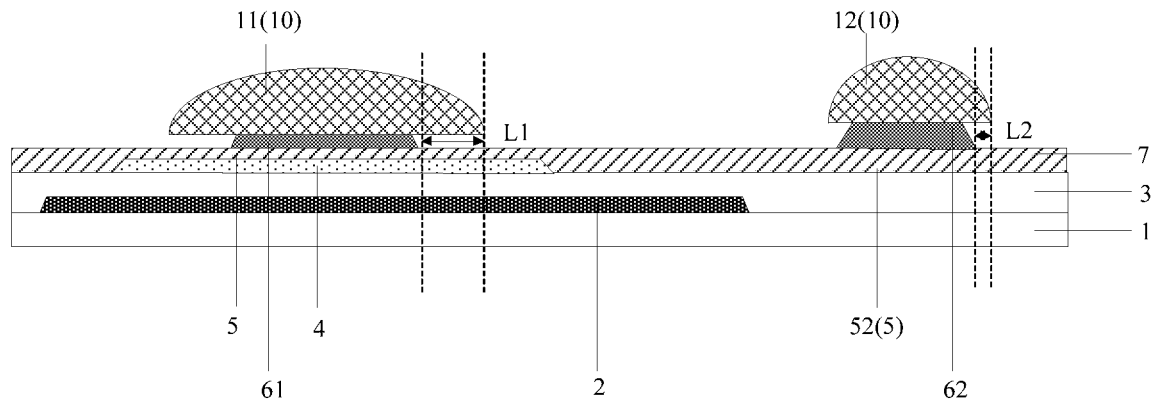
FIG. 10 is a structural schematic diagram of an array substrate having a metal layer 6 etched in an embodiment of the present disclosure.

Step 4, carry out a wet etching process, where by spending the same etching time at all positions, since the metal layer at the position where the gate electrode 61 is required to be formed is thinner, an over-etching amount at this position is larger, and thus a relatively large L1 is formed; and since the metal layer at the position where the signal line 62 is required to be formed is thicker, an over-etching amount at this position is relatively small, and thus a relatively small L2 is formed, and a schematic diagram is as shown in FIG. 10.

Figure 11:
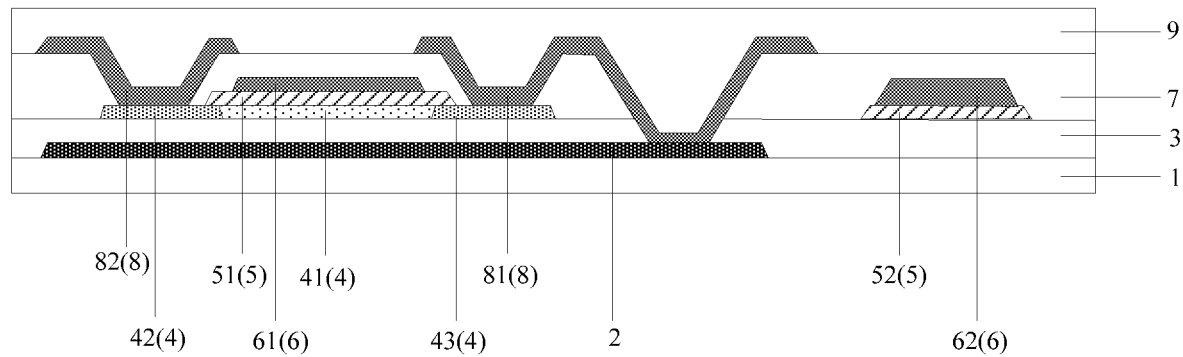
FIG. 11 is a structural schematic diagram of an array substrate having a passivation layer 9 formed in an embodiment of the present disclosure.

Step 5, etch the gate insulation layer 5 and make the active layer 4 conductive, remove the first photoresist portion 11 and the second photoresist portion 12, carry out deposition to form an interlayer dielectric layer 7, carry out patterning and etching to form a pattern of a via hole penetrating the interlayer dielectric layer 7 and a pattern of a via hole penetrating the interlayer dielectric layer and the buffer layer 3 at the same time, carry out deposition and patterning to form a source-drain electrode layer 8, which is as shown in FIG. 11, and then carry out deposition to form an inorganic passivation layer 9.

The beneficial effects of the embodiments of the present disclosure are as follows: in the embodiment of the present disclosure, by making the thickness h1 of the gate electrode 61 perpendicular to the substrate 1 than the thickness h2 of the signal line 62 perpendicular to the substrate 1, when the metal layer including the gate electrode 61 and the signal line 62 is manufactured, the metal layer at a position for forming the gate electrode 61 is thinner, the metal layer at a position for forming the signal line 62 is thicker. Therefore, when the metal layer at different positions are etched under shielding actions of photoresists subsequently, by spending the same etching time, since the metal layer at the position for forming the gate electrode 61 is thinner, an over-etching amount at this position is larger, and a relatively large L1 is formed; and since the metal layer at this position for forming the signal line 62 is thicker, an over-etching amount at this position is small, and a relatively small L2 is formed. Then, when the gate insulation layer is etched subsequently, the insulation tail (GI tail) at the position where the gate electrode 61 is located of the gate insulation layer 51 may be relatively large. Thus, when the active layer 4 is made conductive subsequently, a relatively long region which is not made conductive may be formed, thereby effectively preventing the plasma from transversely diffusing into the channel 41 in the conductor process, and satisfying requirements of characteristics of the thin-film transistor and conductivity of the signal line. Moreover, a risk of metal breakage is reduced to the maximum extent, thereby improving display quality of a product.

Apparently, those skilled in the art can make various modifications and variations to the present disclosure without departing from the spirit and scope of the present disclosure. In this way, if these modifications and variations of the present disclosure fall within the scope of the claims of the present disclosure and equivalent technologies thereof, the present disclosure is further intended to include these modifications and variations.

What is claimed is:

1. An array substrate, comprising:

a substrate;

an active layer, on a side of the substrate, wherein the active layer comprises a channel region, a conductive source region located on one side of the channel region, and a conductive drain region located on the other side of the channel region;

a metal layer, disposed on a side, facing away from the substrate, of the active layer, wherein the metal layer comprises a gate electrode and a signal line, the gate electrode and the signal line are arranged on a same layer, and in a direction perpendicular to the substrate, a thickness of the gate electrode is less than a thickness of the signal line;

a gate insulation layer, between the active layer and the metal layer;

wherein the gate insulation layer comprises: a first insulation portion and a second insulation portion;

the first insulation portion comprises: a first overlap portion overlapping the gate electrode, and a first extension portion extending from the first overlap portion;

the second insulation portion comprises: a second overlap portion overlapping the signal line, and a second extension portion extending from the second overlap portion; and a length of the first extension portion in a first direction is greater than a length of the second extension portion in a direction perpendicular to an extension direction of the signal line; and the first direction is a direction in which one of the conductive source region and the conductive drain region points to the other.

2. The array substrate according to claim 1, wherein the metal layer comprises a first metal layer and a second metal layer;
the first metal layer and the second metal layer are stacked, and the second metal layer is disposed on a side, facing away from the gate insulation layer, of the first metal layer; and
in the direction perpendicular to the substrate, the thickness of the gate electrode is equal to a thickness of the second metal layer, and the thickness of the signal line is equal to a total thicknesses of the first metal layer and the second metal layer.

3. The array substrate according to claim 2, wherein in the direction perpendicular to the substrate, a thickness of the first metal layer is less than the thickness of the second metal layer.

4. The array substrate according to claim 1, wherein a difference between the length of the first extension portion in the first direction and the length of the second extension portion in the direction perpendicular to the extension direction of the signal line ranges from 0.1 μm to 1 μm.

5. The array substrate according to claim 1, wherein the signal line comprises at least one of:
a gate line;
a power line; or
a touch lead.

6. The array substrate according to claim 1, further comprising:
a buffer layer, between the substrate and the active layer; and
a light-shielding layer, between the buffer layer and the substrate;
wherein an orthographic projection of the light-shielding layer on the substrate covers an orthographic projection of the active layer on the substrate.

7. The array substrate according to claim 6, further comprising:
an interlayer dielectric layer, disposed on a side, facing away from a gate insulation layer, of the metal layer; and
a source-drain electrode layer, disposed on a side, facing away from the metal layer, of the interlayer dielectric layer;
wherein the source-drain electrode layer comprises a source electrode and a drain electrode;
the drain electrode is connected with the conductive drain region through a first through hole penetrating the interlayer dielectric layer;
the source electrode is connected with the conductive source region through a second through hole penetrating the interlayer dielectric layer; and
the source electrode is connected with the light-shielding layer through a third through hole penetrating the interlayer dielectric layer and the buffer layer.

8. The array substrate according to claim 7, further comprising: a passivation layer, disposed on a side, facing away from the interlayer dielectric layer, of the source-drain electrode layer.

9. A display panel, comprising the array substrate of claim 1.

10. A display device, comprising the display panel of claim 9.

11. The display panel according to claim 9, the array substrate further comprising:
a gate insulation layer, between the active layer and the metal layer;
wherein the gate insulation layer comprises: a first insulation portion and a second insulation portion;
the first insulation portion comprises: a first overlap portion overlapping the gate electrode, and a first extension portion extending from the first overlap portion;
the second insulation portion comprises: a second overlap portion overlapping the signal line, and a second extension portion extending from the second overlap portion;
a length of the first extension portion in a first direction is greater than a length of the second extension portion in a direction perpendicular to an extension direction of the signal line; and
the first direction is a direction in which one of the conductive source region and the conductive drain region points to the other.

12. The display panel according to claim 11, wherein the metal layer comprises a first metal layer and a second metal layer;
the first metal layer and the second metal layer are stacked, and the second metal layer is disposed on a side, facing away from the gate insulation layer, of the first metal layer; and
in the direction perpendicular to the substrate, the thickness of the gate electrode is equal to a thickness of the second metal layer, and the thickness of the signal line is equal to a total thicknesses of the first metal layer and the second metal layer.

13. The display panel according to claim 12, wherein in the direction perpendicular to the substrate, a thickness of the first metal layer is less than the thickness of the second metal layer.

14. A manufacturing method for an array substrate, comprising:
forming an active layer on a substrate;
forming a metal layer on a side, facing away from the substrate, of the active layer;
wherein a thickness of the metal layer in a first region is less than a thickness of the metal layer in a second region, the first region is a region in which a gate electrode is formed, and the second region is a region in which a signal line is formed;
wherein after the forming the active layer on a substrate, and before the forming the metal layer on the side, facing away from the substrate, of the active layer, the manufacturing method further comprises; and
forming a gate insulation layer on a side, facing away from the substrate, of the active layer; and
after the forming the metal layer on the side, facing away from the substrate, of the active layer, the manufacturing method further comprises:
forming a patterned photoresist layer on a side, facing away from the gate insulation layer, of the metal layer that is: wherein the patterned photoresist layer is provided with a first photoresist portion in a region where the gate electrode is located, and the patterned photoresist layer is provided with a second photoresist portion in a region where the signal line is located;

etching the metal layer in the first region and the second region for the same time under shielding actions of the first photoresist portion and the second photoresist portion, so as to form the gate electrode and the signal line, wherein a line width difference between the first photoresist portion and the gate electrode is greater than a line width difference between the second photoresist portion and the signal line;

etching the gate insulation layer under shielding actions of the first photoresist portion and the second photoresist portion to form the gate insulation layer providing with a first insulation portion and a second insulation portion, wherein the first insulation portion comprises a first overlap portion overlapping the gate electrode, and a first extension portion extending from the first overlap portion, the second insulation portion comprises a second overlap portion overlapping the signal line, and a second extension portion extending from the second overlap portion, a length of the first extension portion in a first direction is greater than a length of the second extension portion in a direction perpendicular to an extension direction of the signal line, and the first direction is a direction in which one of the conductive source region and the conductive drain region points to the other;

making the active layer conductive under shielding actions of the first insulation portion and the second insulation portion, so as to form a conductive source region of the active layer and a conductive drain region of the active layer; and removing the first photoresist portion and the second photoresist portion.

15. The manufacturing method according to claim 14, wherein the forming the metal layer on the side, facing away from the substrate, of the active layer, comprises:
 forming a first metal layer on a side, facing away from the active layer, of the gate insulation layer,
 removing the first metal layer in the first region, and retaining the first metal layer in the second region; and
 forming a second metal layer on a side, facing away from the gate insulation layer, of the first metal layer.

16. The manufacturing method according to claim 14, wherein the etching the metal layer in the first region and the second region for the same time, comprises:
 etching the metal layer in the first region and the second region for the same time with a wet etching process.

17. The manufacturing method according to claim 14, wherein before the forming the active layer on a substrate, the manufacturing method further comprises:
 forming a light-shielding layer on the substrate; and
 forming a buffer layer on the light-shielding layer.

18. The manufacturing method according to claim 17, wherein after the removing the first photoresist portion and the second photoresist portion, the manufacturing method further comprises:
 forming an interlayer dielectric layer on a side, facing away from the gate insulation layer, of the metal layer;
 forming a source-drain electrode layer on a side, facing away from the metal layer, of the interlayer dielectric layer; and
 forming a passivation layer on a side, facing away from the interlayer dielectric layer, of the source-drain electrode layer.

* * * * *